Inventor
GEORGE R. ANTELL
By Percy P. Lantzy
Attorney

Inventor
GEORGE R. ANTELL

By Percy P. Lantzy
Attorney

Inventor
GEORGE R. ANTELL
By Percy P. Lantzy
Attorney

United States Patent Office 3,427,516
Patented Feb. 11, 1969

3,427,516
LIGHT EMITTING JUNCTION DEVICE USING SILICON AS A DOPANT

George Richard Antell, Harlow, Essex, England, assignor to International Standard Electric Corporation, New York, N.Y., a corporation of Delaware Filed May 24, 1966, Ser. No. 552,463
Claims priority, application Great Britain, July 21, 1965, 30,996/65
U.S. Cl. 317—237 13 Claims
Int. Cl. H01l 3/14

ABSTRACT OF THE DISCLOSURE

This is a semiconductor device which has a light emitting pn-junction. This junction is inset to within 10 microns of the surface of a body, when this body, which is formed of a III–V semiconductor compound, is doped with silicon.

This invention relates to semiconductor junction devices, in particular to those devices in which the junction region is capable of emitting light, and to methods of manufacturing such devices.

According to the invention a semiconductor junction device includes a body of semiconductor material having adjacent one face and parallel thereto a junction region at a depth of not more than 10μ.

The invention also provides a method of manufacturing a semiconductor junction device including depositing on the surface of a semiconductor body of one conductivity type a layer of an impurity of the opposite conductivity type and subsequently diffusing the impurity into the body to form a junction region parallel to the face and at a depth not exceeding 10μ.

Diffusion from the solid enables high definition to be obtained by the use of accurate mechanical masking techniques to control the shape of the junction area. Also the use of diffusion from the solid avoids problems of surface erosion and is relatively fast compared with diffusion from the vapour phase.

Extremely shallow junctions allow light of a slightly shorter wavelength to be produced at room temperature compared with previously known light emitting devices.

Embodiments of the invention will now be described with reference to the accompanying drawings in which FIGS. 1 and 2 are respectively a diagrammatic sectional elevation and plan view of a light emitting diode.

Figure 1:
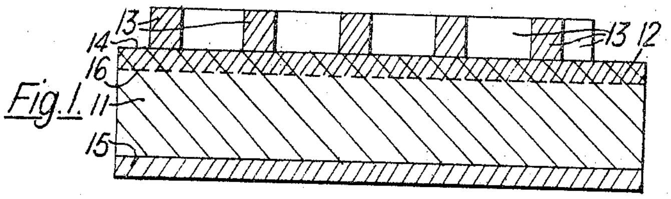
Figure 2:
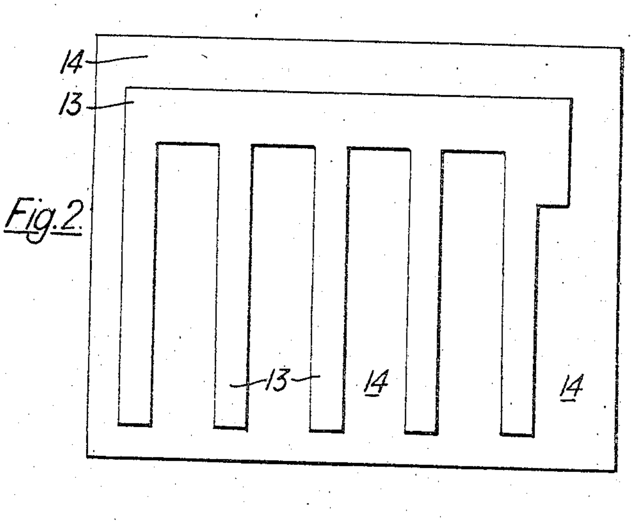

In the structure shown in FIGS. 1 and 2 a slice 11 of P-type GaAs having a free carrier concentration of about $5\times10^{17}$ per cc. has a layer of silicon (not shown) deposited on the upper face. The silicon is deposited by any process which does not involve heating of the GaAs slice. The slice is then heated to a temperature of about 1000° C. for long enough to diffuse a silicon doped N-type region 12 into the slice 11 to a depth of about 1μ. Finally a metallic contact pattern 13 is deposited on the silicon doped surface 14 and a metallic base contact 15 is applied to the opposite face of the slice 11.

When the diode is forward biassed at about 1–2 volts light is emitted from the junction 16 and appears through the open spaces in the metallic pattern 13. The incorporation of silicon in GaAs increases the energy gap slightly and thus reduces the absorption coefficient for the radiation produced by band-to-band transitions in GaAs.

Although the silicon concentration is high enough to increase the energy gap the free carrier concentration is not much more than $5\times10^{18}$ per cc. anywhere in the silicon diffused layer and thus free carrier absorption will not be too great.

The diffusion of silicon in GaAs is fast and since diffusion takes place from the solid it is possible to lay down films of silicon on a GaAs surface by mechanical masking, which should provide more accurately defined edges than those obtained by photolithographic techniques.

At room temperatures peak power is obtained at around 0.88μ compared with the more usual 0.91μ for normal diodes.

Figure 3:
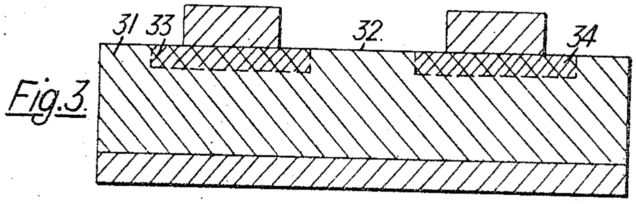
FIG. 3 is a diagrammatic sectional elevation of a pair of light emitting diodes in a common semiconductor body.

In the construction shown in FIG. 3 the slice 31 of gallium arsenide has its upper face 32 masked so that solid silicon is deposited only on two restricted areas. The slice is subsequently heated so that two N-type silicon doped regions 33, 34 are diffused in to a depth of about 1μ. Metallic electrical contacts 35, 36 are attached to the two regions and a base electrical contact 37 is attached to the opposite face. This construction provides two shallow junction light emitting diodes which, when suitably biased, create two patches or rings of light against a dark background, depending on the area of diffused material covered by the metallic contacts.

The light emitting properties of any part of the junction depend to a large extent on the current density at that point. Thus restriction of the current path to certain parts of the junction can be used to control the shape of the light emitting areas.

Figure 4:
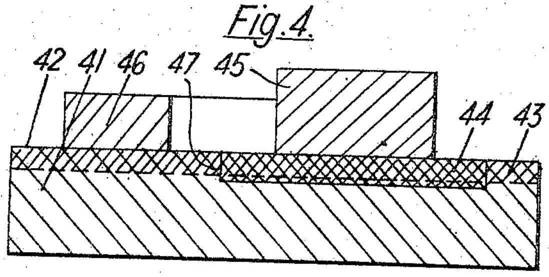
FIGS. 4 and 5 are respectively a diagrammatic sectional elevation and plan view of a light emitting diode with electrical contacts arranged to make the light emitting area a line source.
Figure 5:
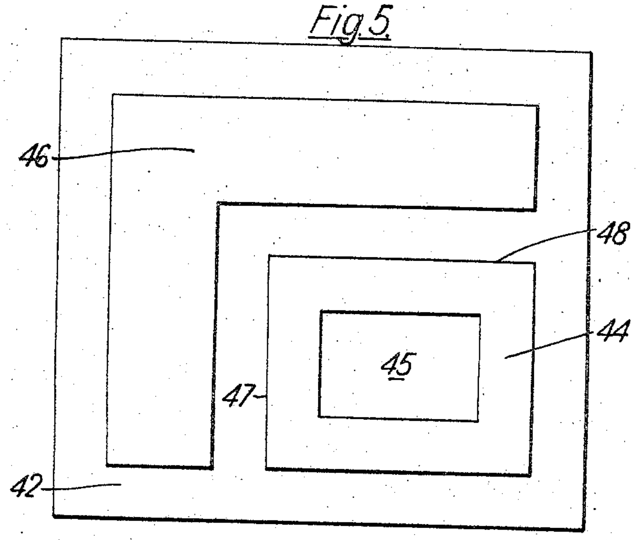

In the structure shown in FIGS. 4 and 5 a semi-insulating GaAs slice 41 has a sputtered zinc-doped silica film (not shown) laid on the upper surface 42.

The slice is then heated to diffuse the zinc into the GaAs to form a P-type region 43 to a depth of about 5μ. A portion of the resultant silica layer is removed to obtain access to the slice 41 and a layer of solid silicon is laid down to cover the exposed area. The slice is again heated and the silicon is allowed to diffuse through the P-type region 43 to a depth of about 6–7μ. The result is an N-type region 44 extending through the P-type region 43. Metal contacts 45 and 46 are deposited on the surface 42, contact 45 being to the region 44 and contact 46 being to the side of the region 44.

When the P-N junction is forward biased current flow is largely confined to the doped regions. Thus the light emission is confined to the edge of the silicon doped region. Moreover since the contact 46 only follows the contour of the region 44 on two sides, the impedance between the contacts 45 and 46 will be lowest across two edges 47 and 48 of the silicon doped region, and highest on the other two edges. The result will be that the light is emitted primarily from a line source along the edges 47 and 48. It will be appreciated that by suitable shaping and placing of the silicon doped region 44 and the contact 46 many sophisticated light emitting line source configurations can be achieved.

Figure 6:
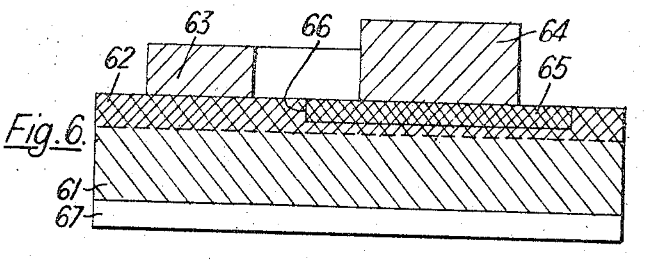
FIG. 6 illustrates an alternative construction to FIG. 4.

An alternative structure to that of FIGS. 4–5 is illustrated in FIG. 6. In this device the starting material is an N-type body 61 with a P-type zinc diffused region 62 about 5μ deep. The zinc is diffused from a sputtered zinc doped silica film and subsequently an aperture is formed in the silica film. A film of solid silicon is then deposited over the aperture and diffused to a depth of about 4μ. Metal contacts 63 and 64 are bonded to the P-type region 62 and the silicon doped N-type region 65 respectively.

In this device, as in the case of the previously described device, current flow is largely restricted by the device configuration to the edge 66 of the region 65 nearest the contact 63, resulting in a line source of light. If a contact layer 67 is applied to the N-type body 61 a device is formed in which the P-type region 62 acts as a base region. If the base width between the two N-type regions is narrow enough a negative voltage between the emitter region 65 and the collector region 61 can cause the collector to react through the base to the emitter and thus short circuit the base. Pulses of current between the emitter 65 and the base 62 will cause emission of light provided there is no voltage on the collector 61. If a voltage is now applied to the collector and the base is shorted then the emitter/collector current will not produce a pulsed light output.

The use of a solid layer or film of silicon as a doping material enables high definition to be achieved by mechanical masking techniques. Provided that the substrate surface and the underside of the mask are both flat to optical standards, the masked outline will be more accurately defined than by photolithographic techniques.

Figure 7:
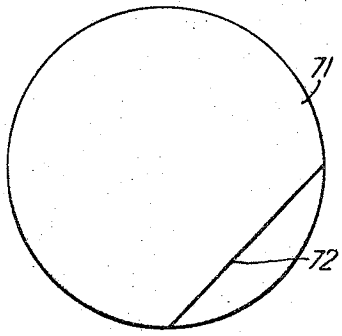
FIGS. 7 to 9 illustrate steps in the manufacture of a shallow junction structure.
Figure 8:
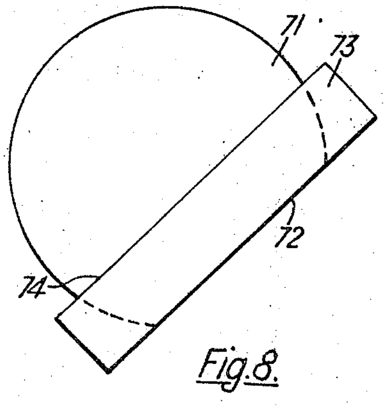
Figure 9:
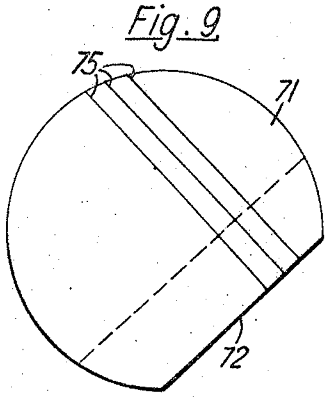

FIGS. 7–9 illustrate the steps in making a shallow junction laser device. A slice 71 of N-type gallium arsenide is prepared with its upper face parallel to the (100) crystallographic plane. The (100) face is coated with zinc doped silica and the slice is heated to form a P-type region about 5μ deep. The remaining silica film is then removed and the (100) face is cleaned and re-polished if necessary ready to receive a mechanical mask. The slice is then cleaved on the (110) plane 72, which is perpendicular to the (100) plane. Another piece of gallium arsenide 73 which also has a prepared (100) surface is cleaved twice on the (110) plane to form a strip with parallel, optically flat, opposite faces. This strip 73 is then placed with its (100) face on the (100) face of the slice 71 and the two are butted against a straight edge (not shown) to ensure that the optically flat face 74 of the strip 73 is truly parallel to the cleft face 72 of the slice 71. Silicon is then sputtered on to the unmasked surface of the slice 71. The silicon coated slice 71 is heated to a temperature of about 1000° C. for a few minutes and the silicon is diffused into the slice to a depth of about 4μ. After diffusion the slice 71 is lapped to about 0.005 in. thick and a silicon dioxide film is deposited on the top surface. Then using photo-lithographic techniques this film is removed selectively and electrical contacts are alloyed to the p and n regions leaving a strip of $SiO_2$ over the junction. The slice is now cleaved, as in FIG. 9, a number times on the lines 75 which are also (110) planes, to provide narrow strips whose longitudinal faces are parallel, optically flat and perpendicular to the edge 76 of the P-N junction between the silicon doped region and the zinc doped region. The strips are then trimmed in length.

Figure 10:
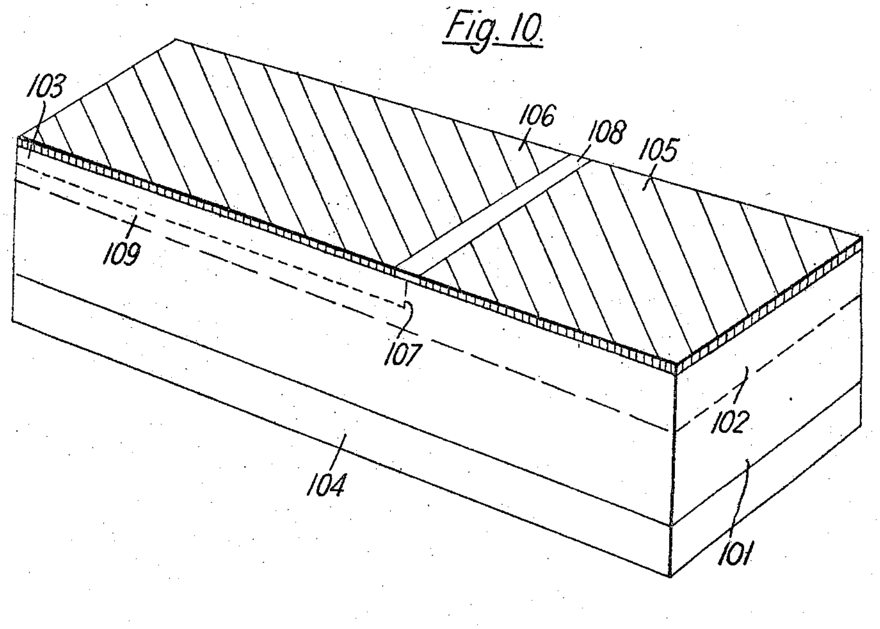
FIG. 10 is a diagrammatic perspective view of the completed shallow junction structure of FIGS. 7–9.

The resultant device is illustrated in FIG. 10 where the original N-type GaAs 101 contains a zinc doped P-type region 102, which in turn contains the N-type silicon doped region 103. The N-type collector 101 is bonded to a heat sink 104 and metallic contacts 105, 106 are bonded to the base region 102 and emitter region 103 respectively. The edge portion 107 of the P-N junction is covered, on the top surface only, by a silicon dioxide film 108.

The operation of the device is substantially the same as that shown in FIG. 6 When the P-N junction is forward biased the edge 107 emits light. Due to the thinness of the portion 109 of the base region between the emitter region 103 and the collector region 101, and its resultant high impedance, the major part of the junction parallel to the (100) plane will not be sufficiently biased to emit light in significant amounts. The result is that a P-N junction core has been produced having a very small junction area about 4μ deep and as wide as the left strip. Furthermore, as previously stated, the application of a voltage to the collector region 101 can be used to modulate the light output of the device.

It is to be understood that the foregoing description of specific examples of this invention is made by way of example only and is not to be considered as a limitation on its scope.

What is claimed is:

1. A semiconductor device, comprising:
- a body of semiconductor material formed of a compound of an element from group III*a* with an element from group V*a* of the Periodic Table of Elements, said body having first and second regions of given and opposite respective conductivity types with a light-emitting P-N junction therebetween and with one of the regions having dopant silicon therein, said junction being located within 10 microns of a given surface of said body; and
- first and second electrodes contacting respective ones of said first and second regions.

2. A semiconductor device according to claim 1, wherein said first region is adjacent said given surface, said first electrode overlies said given surface and has an area less than the area of said junction.

3. A semiconductor device according to claim 2, wherein said second electrode overlies said given surface.

4. A semiconductor device according to claim 1, wherein said second region comprises P-type gallium arsenide and said first region comprises dopant silicon in said second region.

5. A semiconductor device according to claim 2, wherein said first region is inset into and surrounded by said second region.

6. A semiconductor device according to claim 2, wherein said second region is diffused into said body from said given surface, and said first region is inset into said second region to a depth within 5 microns of said surface.

7. A semiconductor device according to claim 6, wherein said second electrode overlies said given surface.

8. A semiconductor device according to claim 6, wherein said body comprises semi-insulating gallium arsenide.

9. A semiconductor device according to claim 6, wherein said body comprises gallium arsenide of said given conductivity type.

10. A semiconductor device according to claim 7, including a third electrode contacting a surface of said body other than said given surface.

11. A semiconductor device according to claim 9, including a third electrode contacting said body.

12. A semiconductor device according to claim 6, wherein a selected one of said regions comprises dopant zinc.

13. A semiconductor device according to claim 1, wherein said given surface is planar and lies in the (100) crystallographic plane.

References Cited

UNITED STATES PATENTS

| | | | |
|---|---|---|---|
| 2,798,989 | 7/1957 | Welker | 317—237 |
| 2,858,275 | 10/1958 | Otto-Gert Falberth | 317—237 X |
| 3,111,611 | 11/1963 | Hunter | 317—235 |
| 3,124,640 | 3/1964 | Armstrong | 174—72 |
| 3,146,137 | 8/1964 | Williams | 148—175 |
| 3,152,023 | 10/1964 | Minamato | 148—177 |

JAMES D. KALLAM, *Primary Examiner.*

U.S. Cl. X.R.

317—234; 313—108